United States Patent
Schulz et al.

(10) Patent No.: US 10,739,497 B2
(45) Date of Patent: Aug. 11, 2020

(54) METHOD FOR PRODUCING A REFLECTION-REDUCING LAYER SYSTEM

(71) Applicant: Fraunhofer-Gesellschaft zur Förderung der angewandten Forschung e.V., München (DE)

(72) Inventors: Ulrike Schulz, Jena (DE); Peter Munzert, Jena (DE); Sabrina Wolleb, Jena (DE); Friedrich Rickelt, Jena (DE); Heiko Knopf, Jena (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 16/469,619

(22) PCT Filed: Dec. 20, 2017

(86) PCT No.: PCT/EP2017/083867
§ 371 (c)(1),
(2) Date: Jun. 13, 2019

(87) PCT Pub. No.: WO2018/115149
PCT Pub. Date: Jun. 28, 2018

(65) Prior Publication Data
US 2020/0081160 A1    Mar. 12, 2020

(30) Foreign Application Priority Data
Dec. 21, 2016   (DE) .................... 10 2016 125 197

(51) Int. Cl.
*G02B 1/111* (2015.01)
*G02B 1/118* (2015.01)
(Continued)

(52) U.S. Cl.
CPC .............. *G02B 1/111* (2013.01); *G02B 1/118* (2013.01); *G02B 1/12* (2013.01); *H01L 21/3065* (2013.01);
(Continued)

(58) Field of Classification Search
CPC ........... G02B 1/111; G02B 1/118; G02B 1/12; G02B 2207/101; G02B 2207/107;
(Continued)

(56) References Cited

U.S. PATENT DOCUMENTS

| 7,914,158 B2 | 3/2011 | Schulz et al. |
| 8,192,639 B2 | 6/2012 | Schulz et al. |

(Continued)

FOREIGN PATENT DOCUMENTS

| DE | 10241708 B4 | 9/2005 |
| DE | 102007009512 A1 | 8/2008 |

(Continued)

*Primary Examiner* — Anita K Alanko
(74) *Attorney, Agent, or Firm* — Slater Matsil, LLP

(57) ABSTRACT

A method for producing a reflection-reducing layer system is disclosed. In an embodiment, a method includes depositing an organic layer on the substrate, generating a nanostructure in the organic layer by a plasma etching process, applying a cover layer to the nanostructure, wherein the organic layer, the nanostructure and the cover layer together form a reflection-reducing structure, wherein the cover layer comprises an inorganic material or an organosilicon compound, and wherein the cover layer is at least 5 nm thick and performing a post-treatment after applying the cover layer, wherein a material of the organic layer is at least partially removed, decomposed or chemically converted, and wherein an effective refractive index $n_{eff,2}$ of the reflection-reducing structure after the post-treatment is smaller than an effective refractive index $n_{eff,1}$ of the reflection-reducing structure before the post-treatment.

18 Claims, 4 Drawing Sheets

(51) Int. Cl.
  *G02B 1/12* (2006.01)
  *H01L 21/3065* (2006.01)
  *C09K 13/00* (2006.01)
  *H01L 21/311* (2006.01)
  *B44C 1/22* (2006.01)
  *B81C 1/00* (2006.01)
  *B82Y 40/00* (2011.01)

(52) U.S. Cl.
  CPC .......... *B44C 1/227* (2013.01); *B81C 1/00531* (2013.01); *B81C 2201/0116* (2013.01); *B81C 2201/0138* (2013.01); *B82Y 40/00* (2013.01); *C09K 13/00* (2013.01); *H01L 21/31138* (2013.01)

(58) Field of Classification Search
  CPC .......... H01L 21/3065; H01L 21/31138; C09K 13/00; B81C 2201/0138; B81C 2201/0116; B81C 1/00531; B44C 1/227; B82Y 40/00
  See application file for complete search history.

(56) References Cited

U.S. PATENT DOCUMENTS

| | | | |
|---|---|---|---|
| 9,039,906 B2* | 5/2015 | Schulz | B29D 11/00865 216/24 |
| 9,939,556 B2* | 4/2018 | Schulz | C23C 14/32 |
| 10,247,856 B2 | 4/2019 | Schulz et al. | |
| 2005/0233083 A1* | 10/2005 | Schulz | B29C 59/14 427/342 |
| 2011/0051246 A1 | 3/2011 | Schulz et al. | |
| 2014/0374377 A1 | 12/2014 | Schulz et al. | |
| 2016/0139302 A1* | 5/2016 | Black | G02B 1/118 428/141 |
| 2016/0216409 A1 | 7/2016 | Schulz et al. | |

FOREIGN PATENT DOCUMENTS

| | | |
|---|---|---|
| DE | 102007059886 A1 | 6/2009 |
| DE | 102008018866 A1 | 10/2009 |
| DE | 102014100769 A1 | 7/2015 |
| DE | 102015203307 B3 | 4/2016 |
| EP | 2966481 A1 | 1/2016 |
| EP | 3051321 A1 | 8/2016 |

* cited by examiner

METHOD FOR PRODUCING A REFLECTION-REDUCING LAYER SYSTEM

This patent application is a national phase filing under section 371 of PCT/EP2017/083867, filed Dec. 20, 2017, which claims the priority of German patent application 102016125197.6, filed Dec. 21, 2016, each of which is incorporated herein by reference in its entirety.

TECHNICAL FIELD

The invention concerns a method for producing a reflection-reducing layer system on a substrate, in particular on a glass or plastic substrate for optical applications.

BACKGROUND

For the anti-reflective coating of surfaces, in particular of optical elements or displays, reflection-reducing interference layer systems are usually used which contain several alternating layers of high-refractive and low-refractive materials. $MgF_2$ with n=1.38 is currently used as a material with a particularly low refractive index in the visible spectral range. The anti-reflection effect of conventional dielectric coating systems could be improved if materials with a lower refractive index were available.

An alternative possibility to reduce the reflection of an optical element is known from German Patent No. DE 10241708 B4. In this process, a nanostructure is created on the surface of a plastic substrate by means of a plasma etching process, which reduces the reflection of the plastic substrate. The antireflection coating of an optical element by creating a nanostructure on its surface has the advantage that a low reflection is achieved over a wide angle of incidence range.

German Patent No. DE 102008018866 A1 describes a reflection-reducing interference layer system on which an organic layer is applied which is provided with a nanostructure by means of a plasma etching process.

SUMMARY OF THE INVENTION

Embodiments provide a process for producing a reflection-reducing layer system with which various surfaces can be coated with a broad-band antireflective coating independent of angle. The reflection-reducing layer system includes a reduced residual reflection and an increased climate stability, in particular good resistance to moist heat.

In various embodiments, in the method for producing the reflection-reducing layer system on a substrate, an organic layer is applied which has a layer thickness between 150 nm and 500 nm according to a preferred embodiment. The organic layer may be applied directly to the substrate or to a layer or layer sequence previously applied to the substrate. In particular, it is possible that an interference layer system of multiple dielectric layers is applied to the substrate before the organic layer is applied. It is also possible to create a refractive index gradient layer in the substrate or in another layer applied to the substrate before the organic layer is applied. This can be done with a plasma etching process, for example.

The organic layer is preferably applied by a vacuum coating process such as thermal evaporation or plasma ion-assisted deposition. Alternatively, other processes are also suitable for applying the organic layer.

The substrate can, for example, be a glass, a plastic or a semiconductor material such as silicon. In particular, the substrate may be an optical element with a surface that is to be antireflective coated. The surface of the substrate can be flat or curved.

According to an embodiment of the process, a nanostructure is subsequently created in the layer of organic material using a plasma etching process. The generation of a nanostructure by means of a plasma etching process is known from the patent specification DE 10241708 B4, the disclosure content of which is hereby incorporated by reference.

After the formation of the nanostructure, a cover layer is applied to the nanostructure in a further step. The cover layer is advantageously composed of an inorganic material or an organosilicon compound, for example, a layer produced by plasma polymerization. The cover layer is preferably at least 5 nm thick. In particular, the cover layer is so thin that the nanostructure is not planarized by the cover layer. The thickness of the cover layer is advantageously between 5 nm and 50 nm, preferably between 15 nm and 35 nm.

The cover layer completely covers the nanostructure, i.e., it reproduces the elevations and depressions of the nanostructure. The covering can be conformal. However, it is also sufficient if the deposited thickness on the flanks and in the depth of the nanostructure is considerably thinner than on the tips. Such a coating naturally forms during evaporation or sputtering.

The organic layer provided with the nanostructure and the cover layer applied to it together form a reflection-reducing structure. The refractive index of the reflection-reducing structure is determined by the proportions of the organic material and the material of the cover layer. For example, the organic material has a refractive index of $1.6 < n_1 < 1.85$ and the cover layer a refractive index of $1.35 < n_2 < 1.7$. Preferably, the refractive index $n_1$ of the organic material is greater than 1.7 (e.g., uracil, melamine) and that of the cover layer material less than 1.5 (e.g., $SiO_2$ with $n_2 = 1.45$).

After the cover layer has been applied, it is advantageous to carry out a post-treatment in the method, whereby the material of the organic layer is at least partially removed, decomposed or chemically converted. The post-treatment may in particular cause the material of the organic layer to be partially converted into NH3 or other gaseous components escaping from the organic layer. The partial decomposition or removal of the organic material is particularly evident in a change in the IR spectrum of the organic material and can thus be detected.

The post-treatment has the advantage that the effective refractive index of the reflection-reducing structure, which comprises the nanostructured organic layer and the cover layer, is reduced. In particular, the effective refractive index $n_{eff,2}$ of the reflection-reducing structure after post-treatment is lower than the effective refractive index $n_{eff,1}$ before post-treatment. Prior to post-treatment, the reflection-reducing structure preferably has an effective refractive index $n_{eff,1}$ in the range between 1.15 and 1.25. The effective refractive index $n_{eff,1}$ after post-treatment is smaller than the effective refractive index $n_{eff,1}$ before post-treatment. After post-treatment, the effective refractive index $n_{eff,2}$ is preferably in the range between 1.03 and 1.23. The reduction of the effective refractive index by means of post-treatment is achieved in particular by the fact that during post-treatment the material escapes from the organic layer partly in the form of gaseous constituents such as NH3 and/or becomes porous.

The reduction of the effective refractive index achieved by post-treatment has the advantage that the anti-reflection effect is further enhanced. In particular, this can further reduce the difference between the effective refractive index of the reflection-reducing structure and the ambient medium, especially air.

In particular, it is possible that the organic component is more decomposed and/or removed towards the surface of the reflection-reducing structure. In this case, a refractive index gradient is formed in the reflection-reducing structure as a result of the post-treatment or this gradient is intensified. At the tips of the nanostructure is then significantly more low refractive coating material located and in the lower area of the nanostructure more higher refractive organic material is located. This gradient character also has a positive effect on broadband antireflection coating.

According to at least one advantageous configuration, the post-treatment includes a temperature treatment at a temperature of more than 70° C. The temperature treatment is preferably carried out at a relative humidity of more than 50%. Such humid-warm conditions are particularly suitable for removing, decomposing or transforming at least part of the organic layer.

Alternatively or in addition, post-treatment may include plasma treatment, UV treatment and/or ion bombardment treatment. In the case of plasma treatment, this may be carried out under vacuum conditions or alternatively under atmospheric pressure. In particular, a microwave plasma may be used. In post-treatment with UV radiation, radiation from near UV or vacuum UV can be used in particular.

According to a preferred design, the reflection-reducing structure has a layer thickness between 150 nm and 500 nm.

According to at least one embodiment, the organic layer is a nitrogen-containing organic material with a conjugated ring-shaped structure containing at least the atoms carbon, nitrogen and hydrogen. Particularly suitable are heterocyclic organic compounds with a purine or pyrimidine backbone, in particular naturally occurring substances such as guanine (2-amino-6-oxo-purine), xanthine (2,6-dihydroxypurine) and uracil (2,4-pyrimidinedione) or mixtures of these materials. Other suitable materials are triazines such as melamine and other high-melting point amines or polyaminoamides, as well as amino acids and their high-melting point derivatives. The material of the organic layer is preferably a high-melting point material, whereby the term "high-melting point" here refers in particular to a material with a melting point above 100° C.

A material that is stable under the post-treatment conditions is advantageously selected for the cover layer so that the structure of the cover layer does not essentially change during post-treatment. The cover layer of the nanostructure preferably consists of an oxide, a fluoride or a nitride. In particular, the cover layer may contain a silicon oxide, an aluminum oxide, a silicon nitride or magnesium fluoride.

In a particularly preferred configuration, the cover layer is between 15 nm and 35 nm thick. In this case, the cover layer is thin enough to conformally cover the nanostructure. On the other hand, the thickness of the cover layer in this area is sufficient for the cover layer to essentially withstand post-treatment unchanged.

In various embodiments, the nanostructure produced in the organic layer has structural elements in the form of elevations and depressions, the average height of which is preferably more than 80 nm, for example, in the range from about 100 nm to about 200 nm. It is advantageous if the nanostructure extends almost through the entire organic layer. In this way, a particularly low effective refractive index of the nanostructured organic layer is achieved. The structural elements preferably have an average width of less than 40 nm. The preferred width of the structural elements is between 15 nm and 35 nm.

The reflection-reducing layer sequence is characterized on the one hand by its particularly good reflection-reducing effect due to the particularly low effective refractive index of the nanostructured organic layer. Furthermore, the reflection-reducing coating is characterized by improved climate stability. In particular, the reflection-reducing coating has the advantage that its optical properties do not change significantly under climatic conditions such as humid heat.

BRIEF DESCRIPTION OF THE DRAWINGS

The invention will be explained in more detail in the following using examples in connection with FIGS. 1 to 4.

In the figures.

Identical or equivalent components are each provided with the same reference signs in the figures. The components shown as well as the proportions of the components among each other are not to be regarded as true to scale.

DETAILED DESCRIPTION OF ILLUSTRATIVE EMBODIMENTS

Figure 1A:
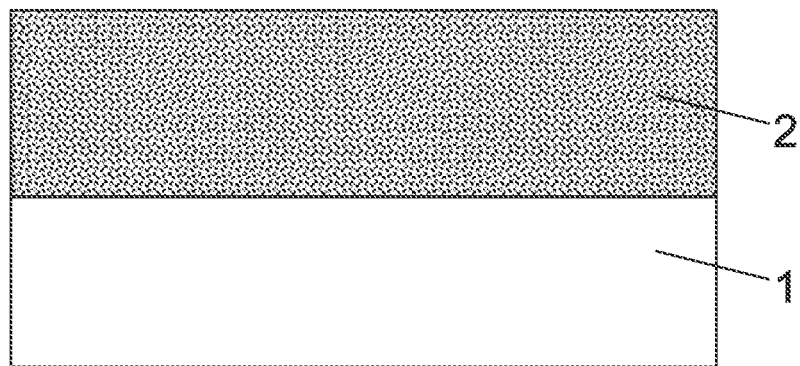
FIGS. 1A to 1D show an example of the method for producing a reflection-reducing layer system using schematically illustrated intermediate steps.

In the intermediate step of the method shown in FIG. 1A, an organic layer 2 was applied to a substrate 1. The substrate 1 may have a flat or curved surface and may comprise, for example, glass, plastic or semiconductor material. In particular, the substrate 1 can be an optical element with a surface to be coated with an anti-reflection coating. For example, substrate 1 can be a lens such as a spectacle lens or the surface of a display.

The organic layer 2 is preferably about 150 nm to 500 nm thick. With a layer thickness in this range, the organic layer 2 is thick enough that a sufficiently deep nanostructure can be produced in it in a further process step.

The organic layer 2 is preferably applied using a vacuum coating process. This has the advantage that the entire reflection-reducing layer system can be applied in a vacuum process. For example, a PVD or CVD process can be used to apply the organic layer 2. Alternatively, it is also possible to apply the organic layer 2 using a wet-chemical process.

The organic layer 2 is formed from a material that can be at least partially removed, decomposed and/or chemically converted in a subsequent process step. Particularly suitable are nitrogen-containing organic materials with a conjugated ring-shaped structure which contain at least the atoms carbon, nitrogen and hydrogen. Examples of such materials are heterocyclic organic compounds with a purine or pyrimidine backbone, in particular also naturally occurring substances such as guanine (2-amino-6-oxo-purine), xanthine (2,6-dihydroxypurine) and uracil (2,4-pyrimidinedione) or mixtures of these materials. Other suitable materials are triazines such as melamine and other high-melting point amines or polyaminoamides, as well as amino acids and their high-melting point derivatives. The material of the organic layer 2 is in particular a material with a melting point above 100° C.

In the example shown in FIG. 1A, the organic layer 2 has been applied directly to the surface of the substrate 1. Alternatively, it is also possible to apply one or more additional layers to the substrate 1 before applying the organic layer 2. The at least one further layer can already have a reflection-reducing effect on the substrate 1, which is to be enhanced with the method described here. For example, a reflection-reducing interference layer system can be applied to substrate 1 before the organic layer 2 is applied.

Figure 1B:
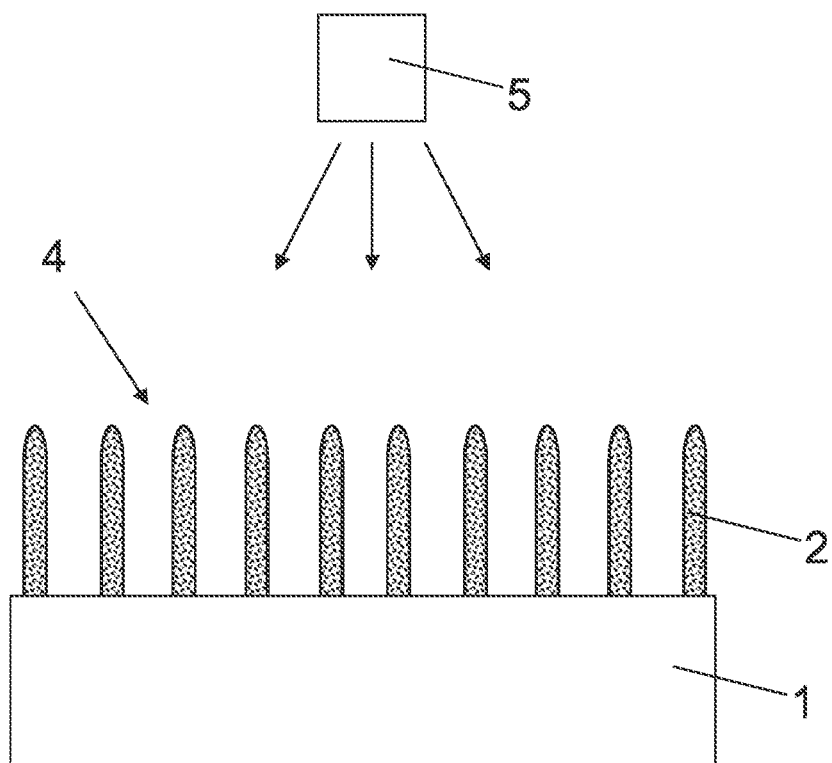

After applying the organic layer 2, a plasma etching process is performed as shown in FIG. 1B to produce a nanostructure 4 in the organic layer 2. The nanostructure 4 is preferably generated by ion bombardment with a plasma ion source 5. For example, an argon-oxygen plasma can be used. Such a plasma etching process is known from the documents DE 10241708 B4 or DE 102008018866 A1 mentioned in the introduction and is therefore not explained in detail.

Before the plasma etching process is performed, a thin initial layer (not shown) can be applied to the organic layer 2 to be structured, which preferably has a thickness of only about 2 nm. The initial layer is preferably a thin oxide layer, nitride layer or fluoride layer. This procedure is known from the publication DE 102008018866 A1.

The nanostructure has a large number of structural elements in the form of elevations and depressions, whereby the elevations are advantageously at least 80 nm high and have a width of advantageously not more than 40 nm and particularly advantageously between 15 nm and 35 nm. The nanostructured organic layer 2 has an effective refractive index $n_{eff,1}$, which is lower than the refractive index of the organic layer 2 before the generation of the nanostructure. Preferably, the effective refractive index $n_{eff,1}$ of the nanostructured organic layer 2 is between 1.15 and 1.25.

Figure 1C:
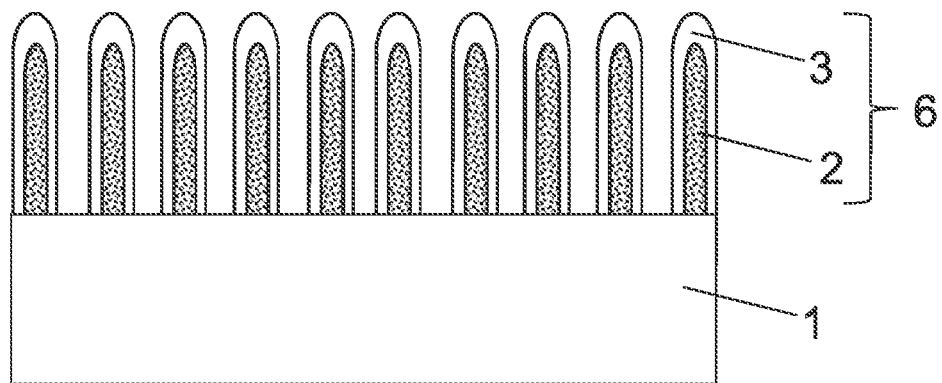

In a further method step which is shown in FIG. 1C, a cover layer 3 is applied to the nanostructured organic layer 2. The cover layer 3 is preferably an inorganic layer, in particular an oxide, nitride or fluoride layer such as silicon oxide, aluminum oxide, silicon nitride or magnesium fluoride. Alternatively, the cover layer 3 can contain an organosilicon compound, such as a plasma polymer. A particularly suitable material for the cover layer is $SiO_2$.

The coating 3 is advantageously no thicker than 50 nm. The thickness of the cover layer 3 is preferably between 5 nm and 35 nm, especially between 15 nm and 35 nm. The thin cover layer 3 covers the nanostructure of the organic layer 2 advantageously conformally, i.e., it reproduces the elevations and depressions of the organic layer 2. Together with the organic layer 2 which has the nanostructure 4, the cover layer 3 forms a reflection-reducing structure 6.

Figure 1D:
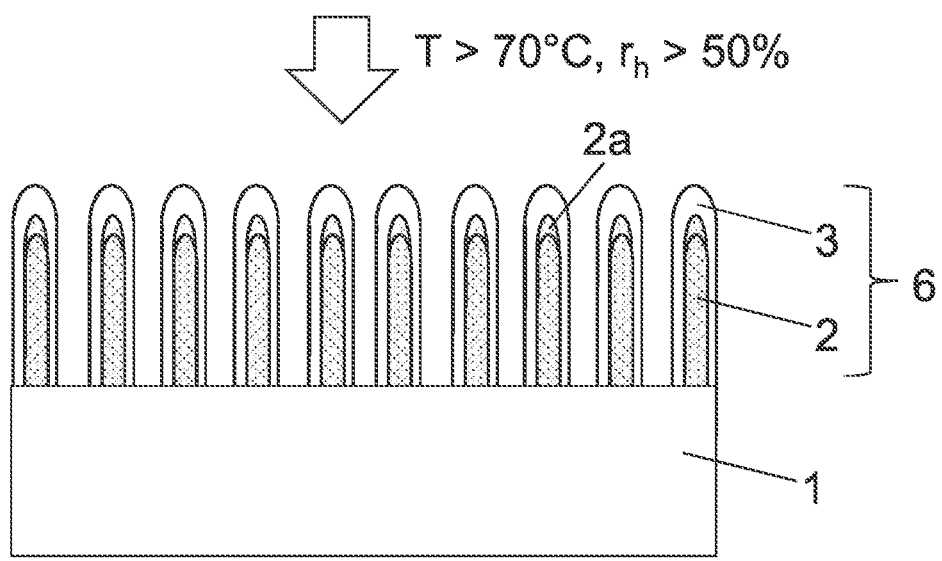

In a further process step, which is shown in FIG. 1D, the previously produced reflection-reducing structure 6 comprising the nanostructured organic layer 2 and the cover layer 3 is post-treated. The post-treatment is, for example, a temperature treatment, which is preferably carried out at a temperature of $T \geq 70°$ C. Preferably, the temperature treatment is carried out at a high relative humidity $r_h \geq 50\%$.

A preferred form of post-treatment is the application of an oxygen-containing plasma from an ion source 5, as previously used for the etching step of the organic layer 2. The treatment can then take place in the same vacuum process immediately after the deposition of the cover layer 3.

The post-treatment causes the material of the organic layer 2 to be at least partially removed, decomposed and/or converted. In particular, it is possible that at least part of the organic material of organic layer 2 is decomposed into gaseous components, in particular $NH_3$, which escape from the layer system. The gaseous components may escape in particular through the thin cover layer 3. Due to the fact that the cover layer 3 has only a very small thickness and is applied to the nanostructured organic layer 2, the cover layer 3 can have at least a low porosity, which allows gaseous components to escape from the organic layer 2.

During post-treatment, cavities and/or porous areas 2a can form, especially below the cover layer 3. However, it can also be achieved that the material of the organic layer 2 changes overall. A change of the material of the organic layer 2 shows up in particular in a change of the IR spectra.

The cover layer 3 of inorganic material or the organosilicon compound is advantageously unaffected by the post-treatment, so that its properties, in particular its shape and thickness, do not essentially change during the post-treatment.

The post-treatment has the advantage that the effective refractive index of the reflection-reducing structure 6 is further reduced. The effective refractive index $n_{eff,2}$ of the reflection-reducing structure 6 after post-treatment is lower than the effective refractive index $n_{eff,1}$ before post-treatment. The effective refractive index $n_{eff,2}$ of the reflection-reducing structure 6 after post-treatment is preferably between 1.03 and 1.23. The particularly low effective refractive index after post-treatment has the advantage that the reflection-reducing effect is further increased.

It is also possible that the organic component is more strongly decomposed and/or removed towards the surface of the reflection-reducing structure 6 and thus a refractive index gradient is formed or strengthened. At the tips of the nanostructure is then significantly more low refractive cover layer material located and in the lower area of the nanostructure is more higher refractive organic material located. In this case, the effective refractive index $n_{eff,2}$ decreases in the direction from the substrate 1 to the surface. Preferably the effective refractive index $n_{eff,2}$ in a region of the reflection-reducing structure facing the substrate 1 is at least regionally $1.15 < n_{eff,2} < 1.23$, and in a region facing the cover layer 3 is at least regionally $1.03 < n_{eff,2} < 1.1$. A particularly good reflection-reducing effect is achieved by the refractive index gradient produced in this way.

In addition, the reflection-reducing layer system produced in this way has the advantage that the optical properties do not change significantly in a humid, warm climate. Thus, the reflection-reducing coating is characterized by improved climate stability.

Figure 2:
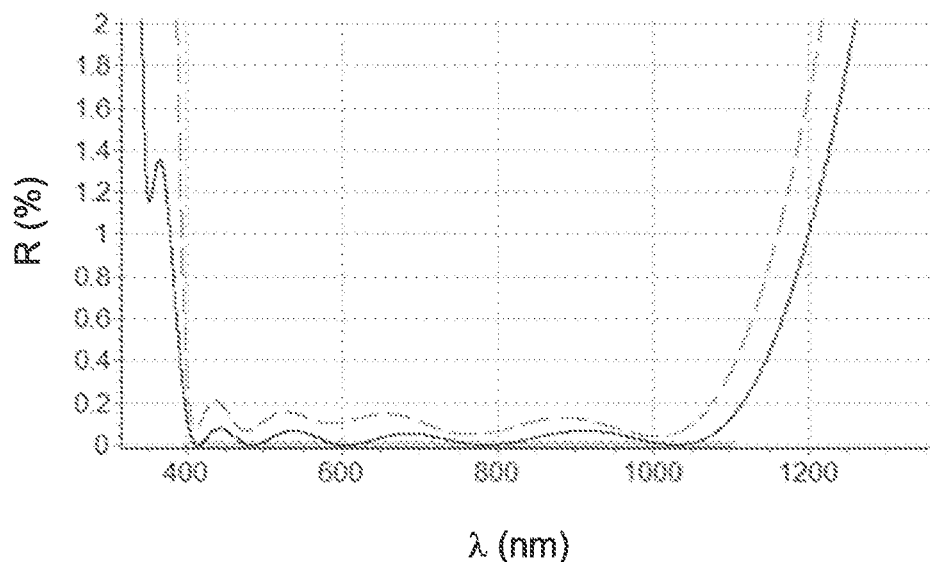
FIG. 2 shows a graphic representation of the reflection R as a function of the wavelength λ in an example of a reflection-reducing layer system produced with the process before post-treatment and after post-treatment.

FIG. 2 shows the reflection R as a function of the wavelength λ for a reflection reducing layer system produced according to an example of the method. In this example, a glass substrate of type B270 with a refractive index $n_S=1.53$ was used. In a first step, a dielectric interference layer system with eight alternating $TiO_2$ layers and $SiO_2$ layers was deposited on the glass substrate by evaporation. The interference layer system in this example consists starting from the substrate of the layer sequence 10 nm $TiO_2$/50 nm $SiO_2$/28 nm $TiO_2$/23 nm $SiO_2$/138 nm $TiO_2$/22 nm $SiO_2$/22 nm $TiO_2$/100 nm $SiO_2$. A 200 nm thick organic layer of uracil was deposited on the interference layer system by evaporation. In the organic uracil layer, a plasma etching process was subsequently used to produce a nanostructure with structural elements about 120 nm high. In a further step, a 30 nm thick $SiO_2$ layer was applied to the nanostructure as a cover layer. The effective refractive index of the reflection-reducing structure made up of the organic layer and the top layer is about $n_{eff,1}=1.22$.

In a further step, the layer system produced in this way was post-treated to complete the reflection-reducing layer system. In the example, a plasma treatment was carried out for post-treatment. Post-treatment was carried out in a microwave plasma system for 10 minutes in an $O_2$ plasma with a power of 400 W and a pressure of $3*10^{-2}$ mbar.

The dashed line in FIG. 2 shows the reflection before post-treatment and the solid line shows the reflection after post-treatment. It can be seen that the residual reflection, especially in the spectral range between 400 nm and 1000 nm, is further reduced by the post-treatment. The nanostructured organic layer has an effective refractive index of only $n_{eff,2}=1.15$ after post-treatment. It has also been found that the optical properties of the reflection-reducing layer system produced in this way do not change during storage for a period of 48 hours in a humid, warm climate (85% relative humidity, T=80° C.) or at a very high temperature (T=110° C.).

Figure 3:
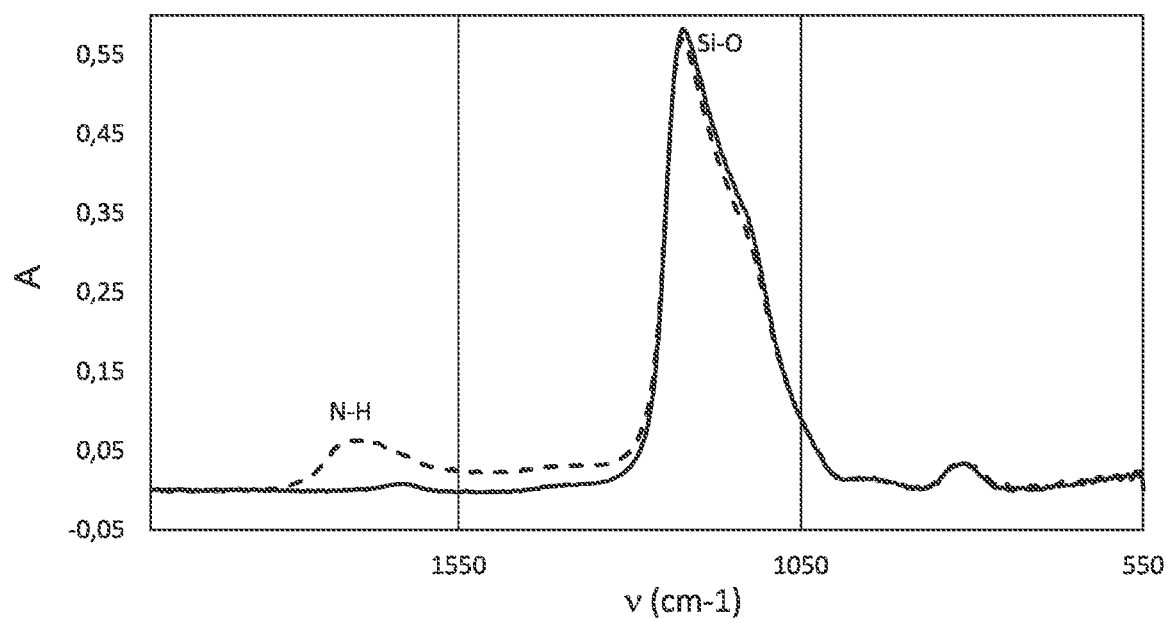
FIG. 3 shows a graphical representation of an infrared spectrum of the reflection-reducing layer system according to the example of FIG. 2 before post-treatment and after post-treatment.

FIG. 3 shows measured FTIR spectra of the reflection-reducing layer system according to the example given in FIG. 2 before and after plasma post-treatment. The absorption A (in arbitrary units) is shown as a function of the wavenumber. The infrared spectrum before post-treatment (dashed line) shows clear signals of the organic material (in particular the N—H band) together with the pronounced signal of the $SiO_2$ component (Si—O band). In contrast, the infrared spectrum of the reflection-reducing structure post-treated in microwave plasma (solid line) hardly shows bands of the organic component.

Figure 4:
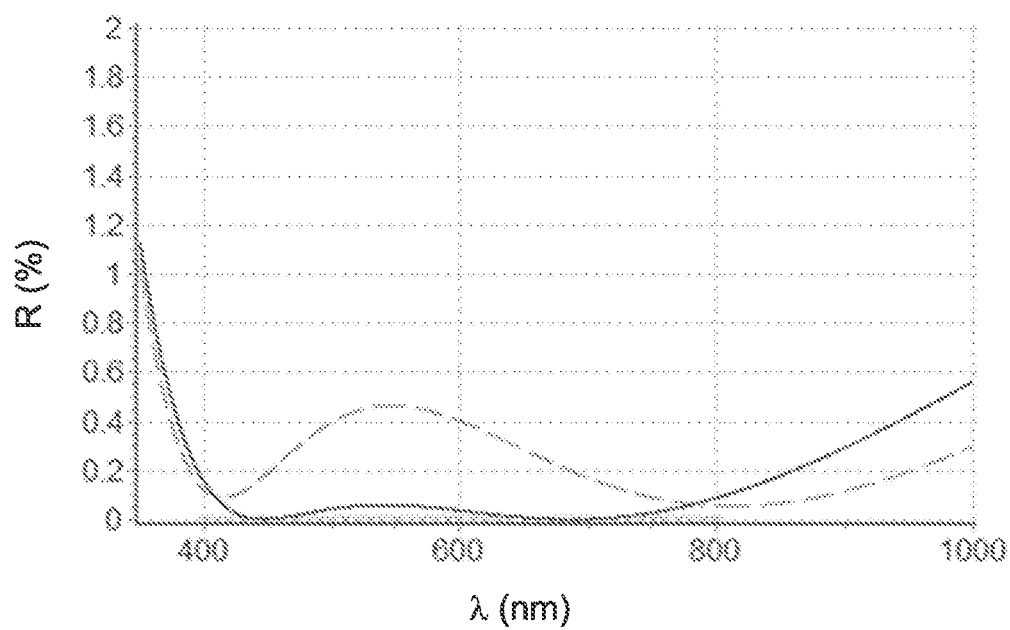
FIG. 4 shows a graphic representation of the reflection R as a function of the wavelength λ in another example of a reflection-reducing layer system produced with the process before post-treatment and after post-treatment.

FIG. 4 shows the reflection R as a function of the wavelength λ for a reflection-reducing layer system that was produced according to another example of the method. In this example, a plastic substrate made of Zeonex with a refractive index $n_S=1.53$ was used. In a first step, a first nanostructure with a depth of 100 nm and an effective refractive index of n=1.35 has been produced in the plastic substrate by a first plasma etching process.

A 220 nm thick organic layer of xanthine was deposited by vapor deposition onto the first nanostructure produced in the plastic substrate. A second plasma etching process was subsequently used to produce a second nanostructure in the organic xanthine layer, which has structural elements with a height of about 120 nm. In a further step, a 20 nm thick $SiO_2$ layer was applied as a cover layer to the second nanostructure. The effective refractive index of the second nanostructure with the cover layer is about $n_{eff,1}=1.18$.

In a further step, the layer system produced in this way was post-treated to complete the reflection-reducing layer system. In the example, a plasma treatment was carried out for post-treatment. The post-treatment was carried out directly in the coating plant (type Leybold SyrusPro with the plasma ion source type APS). The plasma treatment was carried out with a mixture consisting of 35% argon and 65% oxygen, a maximum ion energy of 100 eV (bias voltage 100 V) for 10 minutes at a pressure of $3*10^{-4}$ mbar.

The dashed line in FIG. 3 shows the reflection before post-treatment and the solid line shows the reflection after post-treatment. It can be seen that the residual reflection, especially in the spectral range between about 400 nm and about 800 nm, is further reduced by the post-treatment. The anti-reflection structure has an effective refractive index of only $n_{eff,2}=1.13$ after post-treatment. It has also been found that the optical properties of the reflection-reducing layer system produced in this way do not change further during storage for a period of 48 hours in a humid, warm climate (85% relative humidity, T=50° C.) or at a very high temperature (T=100° C.).

The invention is not limited by the description based on the examples. Rather, the invention includes any new feature and any combination of features, which in particular includes any combination of features in the claims, even if that feature or combination itself is not explicitly stated in the claims or examples.

The invention claimed is:

1. A method for producing a reflection-reducing layer system on a substrate, the method comprising:
   depositing an organic layer on the substrate;
   generating a nanostructure in the organic layer by a plasma etching process;
   applying a cover layer to the nanostructure, wherein the organic layer, the nanostructure and the cover layer together form a reflection-reducing structure, wherein the cover layer comprises an inorganic material or an organosilicon compound, and wherein the cover layer is at least 5 nm thick; and
   performing a post-treatment after applying the cover layer, wherein a material of the organic layer is at least partially removed, decomposed or chemically converted, and wherein an effective refractive index $n_{eff,2}$ of the reflection-reducing structure after the post-treatment is smaller than an effective refractive index $n_{eff,1}$ of the reflection-reducing structure before the post-treatment.

2. The method according to claim 1, wherein cavities and/or porous regions are formed below the cover layer during the post-treatment.

3. The method according to claim 1, wherein the effective refractive index $n_{eff,1}$ of the reflection-reducing structure before the post-treatment is $1.15<n_{eff,1}<1.25$.

4. The method according to claim 1, wherein the effective refractive index $n_{eff,18}$ is of the reflection-reducing structure after the post-treatment is $1.03<n_{eff,2}<1.23$.

5. The method according to claim 1, wherein the reflection-reducing structure has a refractive index gradient after the post-treatment, and wherein the effective refractive index $n_{eff,2}$ in a region of the reflection-reducing structure facing the substrate is at least regionally $1.15<n_{eff,2}<1.23$, and $1.03<n_{eff,2}<1.1$ in a region facing the cover layer at least regionally.

6. The method according to claim 1, wherein the post-treatment comprises a temperature treatment at a temperature greater than 70° C.

7. The method according to claim 6, wherein the temperature treatment is performed at a relative humidity of more than 50%.

8. The method according to claim 1, wherein the post-treatment comprises a plasma treatment, a treatment with UV radiation or a treatment by ion bombardment.

9. The method according to claim 1, wherein the reflection-reducing structure is between 150 nm and 500 nm thick.

10. The method according to claim 1, wherein the organic layer comprises a nitrogen-containing organic material having a conjugated ring-shaped structure containing at least atoms carbon, nitrogen and hydrogen.

11. The method according to claim 1, wherein the organic layer contains at least one of
   a heterocyclic organic compound having a purine or pyrimidine backbone,
   a triazine, an amine or polyaminoamide, or an amino acid or a derivative of an amino acid, having a melting point >100° C.

12. The method according to claim 11, wherein triazine is melamine.

13. The method according to claim 1, wherein the organic layer contains guanine (2-amino-6-oxo-purine), xanthine (2,6-dihydroxypurine), uracil (2,4-pyrimidinedione) or mixtures of these materials.

14. The method according to claim 1, wherein the cover layer comprises an oxide, a fluoride or a nitride.

15. The method according to claim 1, wherein the cover layer comprises $SiO_2$, $Al_2O_3$ or $MgF_2$.

16. The method according to claim 1, wherein the cover layer is between 15 nm and 35 nm thick.

17. The method according to claim 1, wherein the reflection-reducing structure comprises structural elements in form of elevations and depressions having an average height of more than 80 nm.

18. The method according to claim 1, wherein the reflection-reducing structure comprises structural elements in form of elevations and depressions having an average width of less than 40 nm.

\* \* \* \* \*